US007050915B2

(12) United States Patent
Viss (10) Patent No.: US 7,050,915 B2
(45) Date of Patent: May 23, 2006

(54) PERIODIC JITTER CHARACTERIZATION USING PSEUDO-RANDOM SAMPLING

(75) Inventor: Marlin Viss, Santa Rosa, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 42 days.

(21) Appl. No.: 10/687,031

(22) Filed: Oct. 16, 2003

(65) Prior Publication Data

US 2005/0086016 A1   Apr. 21, 2005

(51) Int. Cl.
*G01R 13/00* (2006.01)
*G06F 19/00* (2006.01)

(52) U.S. Cl. ............................ 702/69; 702/75; 702/76; 702/79

(58) Field of Classification Search .................. 702/66, 702/69, 71, 73, 74, 75, 76, 79; 324/76.12, 324/76.13, 76.15, 76.38, 76.77; 375/226; 327/105, 107
See application file for complete search history.

(56) References Cited

U.S. PATENT DOCUMENTS

| 5,293,520 A * | 3/1994 | Hayashi .................. 324/76.77 |
| 6,263,290 B1 * | 7/2001 | Williams et al. .............. 702/71 |
| 2004/0146097 A1 * | 7/2004 | Jungerman et al. ......... 375/226 |

FOREIGN PATENT DOCUMENTS

| EP | EP 0 543 139 | 5/1993 |
| WO | WO 03/093842 | 11/2003 |

OTHER PUBLICATIONS

GB Search Report Under Section 17 dated Feb. 23, 2005.

* cited by examiner

*Primary Examiner*—Bryan Bui
(74) *Attorney, Agent, or Firm*—John L. Iwperato (57) ABSTRACT

A method and system characterize jitter of an applied signal. The characterization includes acquiring a set of pseudo-randomly timed samples at a designated position on the signal, assigning a jitter value to each of the pseudo-randomly timed samples in the acquired set, and selecting a frequency from an array of frequencies based on a correlation of the assigned jitter values with the frequencies in the array. The periodic jitter associated with the signal is designated to have the frequency within the array of frequencies that has the highest correlation to the assigned jitter values.

20 Claims, 6 Drawing Sheets

PERIODIC JITTER CHARACTERIZATION USING PSEUDO-RANDOM SAMPLING

BACKGROUND OF THE INVENTION

High speed signals in communication systems are often corrupted by signal timing instabilities, typically referred to as signal jitter. Signal jitter can include various components, such as random jitter, data dependent jitter, and periodic jitter. The periodic jitter can be characterized by determining the frequency of the periodic jitter, which is useful for identifying the source of the periodic jitter.

Sampling systems, such as equivalent-time sampling oscilloscopes, are well-suited for characterizing high speed signals that have repetitive bit patterns. Highly stable time bases within the sampling systems also make the sampling systems suitable for characterizing periodic jitter. However, the sampling rates of the sampling systems are typically lower than the bit rates of the high speed signals and the frequencies of the periodic jitter that may be present on the signals. This under-sampling results in aliasing, which impairs the ability of the sampling system to characterize periodic jitter. Particularly, this aliasing makes it difficult for the sampling system to distinguish between actual signal components of the periodic jitter and aliased signal components that result from the under-sampling. Accordingly, there is a need for a scheme for characterizing periodic jitter that distinguishes actual signal components of periodic jitter from the aliased signal components of the periodic jitter.

SUMMARY OF THE INVENTION

A system and method according to the embodiments of the present invention characterize jitter of an applied signal. The characterization includes acquiring a set of pseudo-randomly timed samples at a designated position on the signal, assigning a jitter value to each of the pseudo-randomly timed samples in the acquired set, and selecting a frequency from an array of frequencies based on a correlation of the assigned jitter values with the frequencies in the array. The periodic jitter associated with the signal is designated to have the frequency within the array of frequencies that has the highest correlation to the assigned jitter values.

DETAILED DESCRIPTION OF THE EMBODIMENTS

Figure 1:
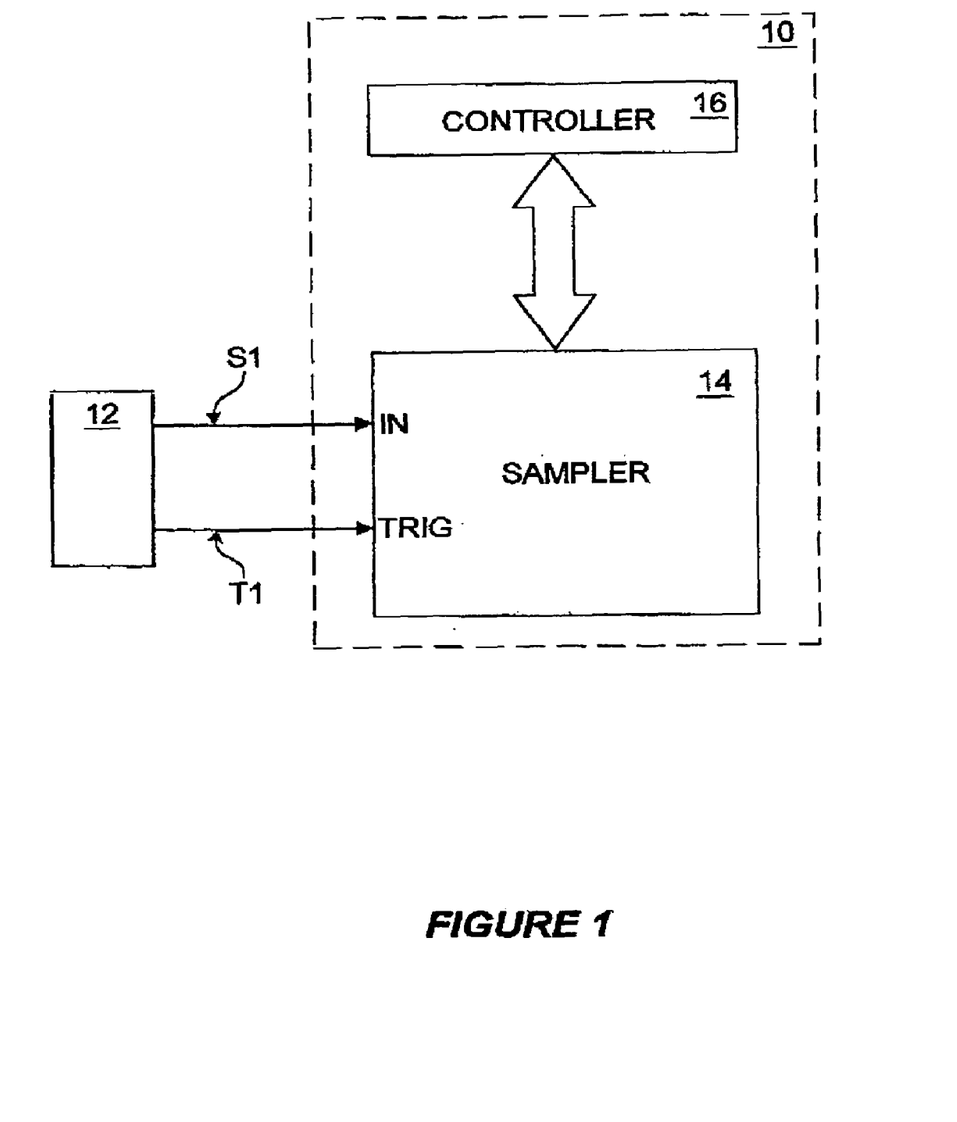
FIG. 1 shows a sampling system for characterizing periodic jitter of repetitive signals according to embodiments of the present invention.

FIG. 1 shows a sampling system 10 suitable for characterizing periodic jitter of a signal S1 according to embodiments of the present invention. The signal S1 is typically a high speed data signal, or other signal, having an associated bit rate R1 and pattern length P1. While the signal S1 is either repetitive, or semi-repetitive with one or more sequences that repeat with each pattern length Pl, the signal S1 is hereinafter referred to as "repetitive signal S1". A source 12, typically a communication system, network node, instrument, device or other element, provides the repetitive signal S1 to a sampler 14 within the sampling system 10. A pattern trigger T1, typically provided by the source 12 or derived from the repetitive signal S1, is applied to a trigger input TRIG of the sampler 14, providing a timing reference for the acquisition of samples by the sampler 14.

The sampler 14 is an equivalent-time sampling oscilloscope, signal digitizer, analog-to-digital converter or other suitable sample acquisition system. The sampler 14 has a sampling rate $R_S$ that is typically lower than the bit rate R1 of the repetitive signal S1 and the frequencies of the periodic jitter that may be present on the repetitive signal S1. For example, when the sampler 14 is an AGILENT TECHNOLOGIES, INC. model 86100 DCA, a typical sampling rate $R_S$ is 40 kHz, whereas the bit rate R1 of a typical repetitive signal S1 may be as high as 10 Gbits/second and the periodic jitter may have frequencies as high as 100 MHz. The sampling system 10 includes a controller 16 that initiates sample acquisitions according to the pattern trigger T1 and processes acquired samples to characterize the periodic jitter present on the repetitive signal S1.

Figure 2:
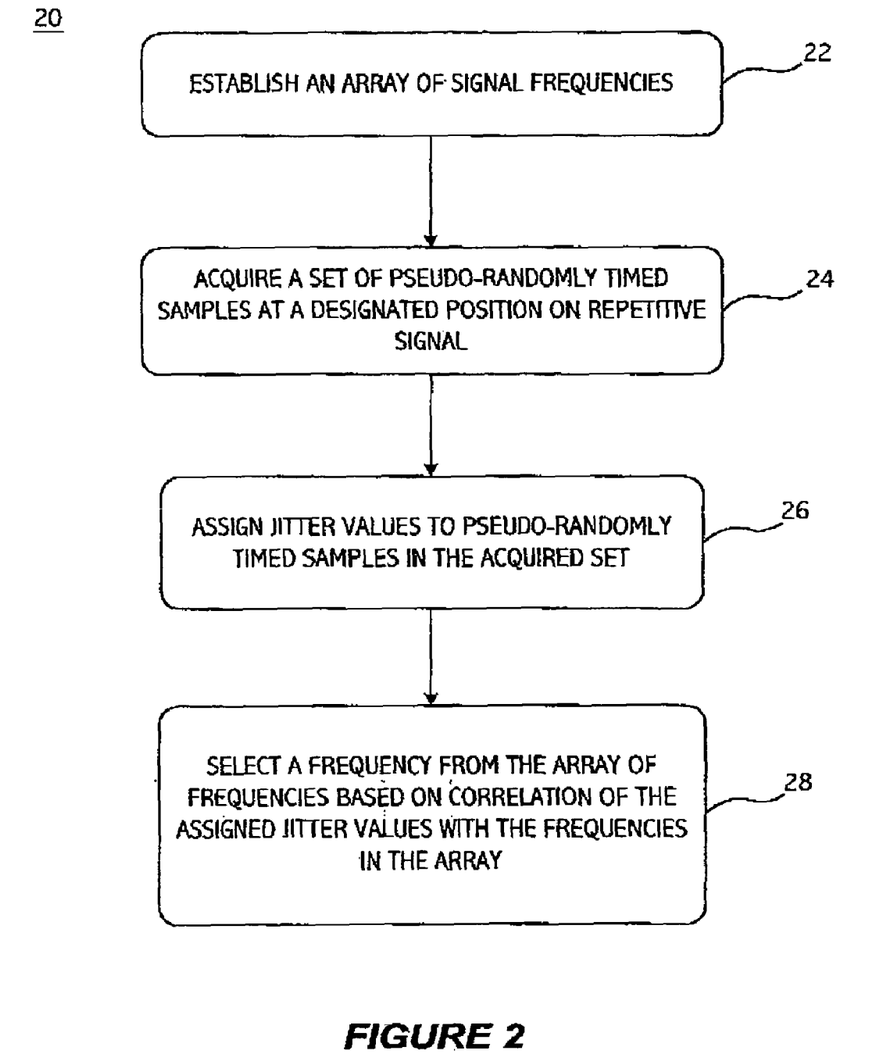
FIG. 2 shows a method for characterizing periodic jitter according to embodiments of the present invention.

FIG. 2 shows a method 20 for characterizing periodic jitter, suitably implemented with the sampling system 10. The method 20 includes establishing an array F of frequencies f (step 22), acquiring a set $S_r$ of pseudo-randomly timed samples at a designated position 17 in the repetitive signal S1 (step 24), assigning a jitter value to each of the samples in the acquired set $S_r$ (step 26) and selecting a frequency $f_J$ from the array F of frequencies f based on correlation of the assigned jitter values with frequencies f in the array F (step 28). The periodic jitter associated with the repetitive signal S1 is designated to have the frequency $f_J$, which is the frequency within the array F of frequencies f that has the highest correlation.

According to one embodiment of the present invention, the array F of frequencies f in step 22 includes frequencies identified as suspect, for example, frequencies of interference signals or interference sources, oscillation frequencies of components within the source 12 providing the repetitive signal S1, or other identified frequencies of periodic jitter imposed on the repetitive signal S1. In an alternative embodiment of the present invention, the array F of frequencies f includes the frequency $f_{PEAK}$ of a signal peak $S_{PEAK}$ in a spectrum SPER (shown in FIG. 4A) resulting from uniform periodic sampling at a designated position 19 of the repetitive signal S1 at a sampling rate $R_S$ that is lower than the bit rate R1 of the repetitive signal S1, and frequencies f that are offset from the frequency $f_{PEAK}$ by integer multiples n of the sampling rate $R_S$. Thus, in this embodiment, the array F includes the frequencies $\{f_{PEAK} \pm n\, R_S\}$, where the integer multiple n has integer values such that $0 \leq n \leq R1/(2RS)$.

Figure 3:
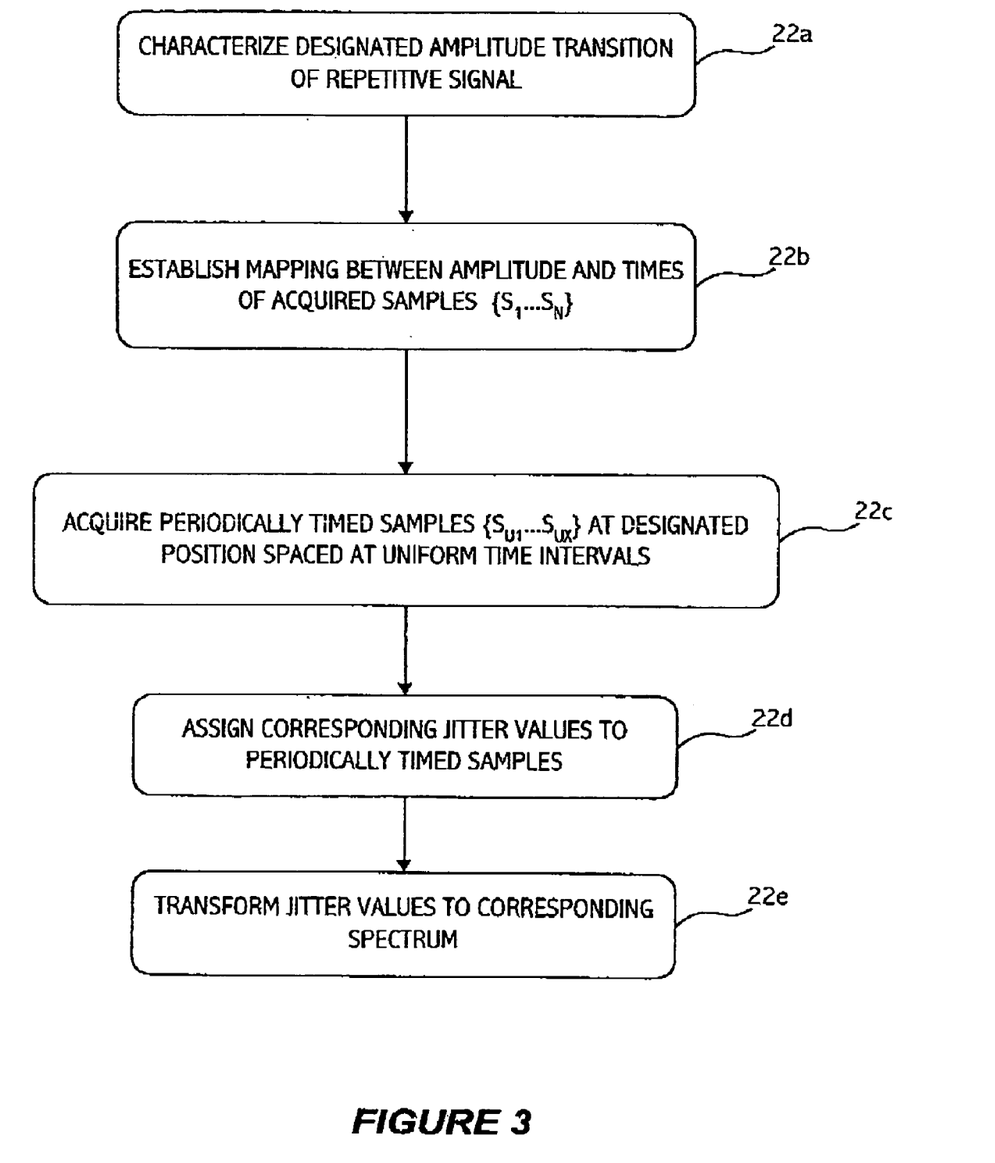
FIG. 3 shows a detailed view of an alternative embodiment of the method of FIG. 2.

FIG. 3 shows exemplary steps 22a–22e for establishing the array F of frequencies f in step 22 in the embodiment where the array F includes the set of frequencies $\{f_{PEAK}+n\, Rx\}$ based on the signal peak $S_{PEAK}$ in the spectrum SPER. Steps 22a and 22b comprise characterizing the relationship between amplitude and time on a designated amplitude transition 13 of the repetitive signal S1. Typically, the amplitude transition 13 is a rising or falling edge transition between logic states encoded in the bit stream of the repetitive signal S1. However, the amplitude transition 13 is alternatively any suitable feature of the repetitive signal S1 exhibiting an amplitude change versus time that repeats with the pattern length P1.

Figure 4A:
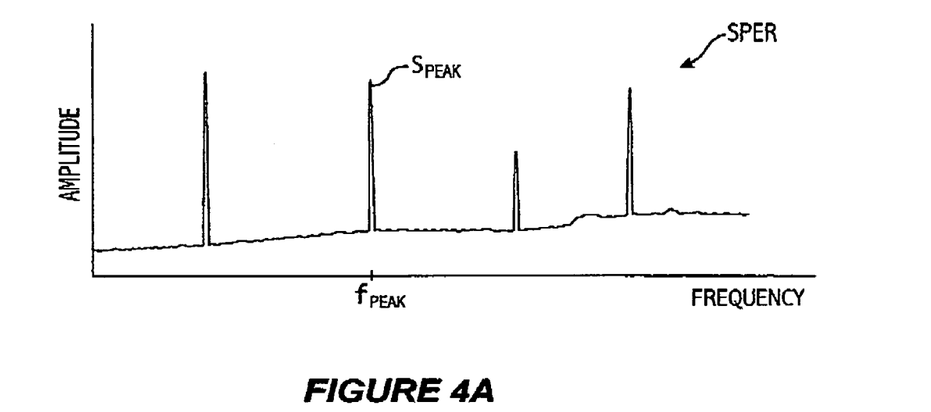
FIGS. 4A–4F show exemplary waveforms at various stages in the characterization of periodic jitter according to embodiments of the present invention.
Figure 4B:
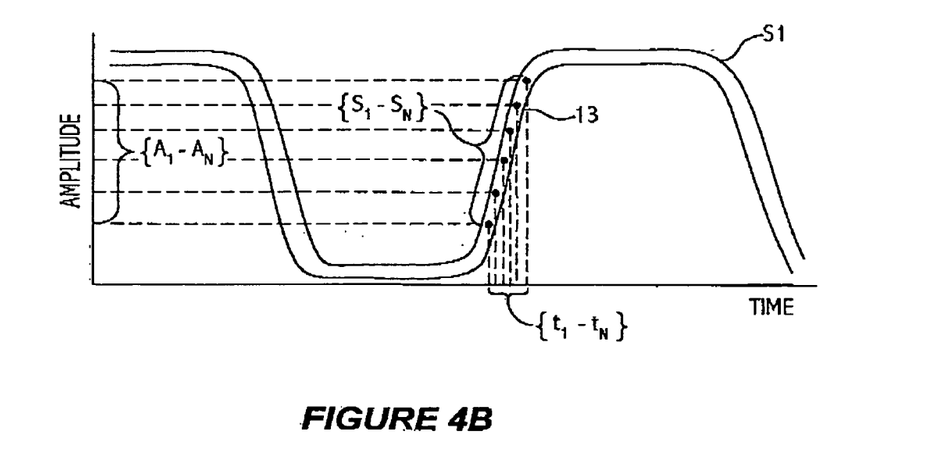

In step 22a, the designated amplitude transition 13 is characterized. This characterization includes, for example, acquiring samples $\{S_1 \ldots S_N\}$ at various times $\{t_1 \ldots t_N\}$ along a repeating edge transition in the repetitive signal S1 according to the pattern trigger T1, using equivalent-time sampling techniques. FIG. 4B shows an example of samples $\{S_1 \ldots S_N\}$ acquired along a rising edge transition.

In step 22b, a mapping between amplitudes $\{A_1 \ldots A_N\}$ of the acquired samples $\{S_1 \ldots S_N\}$ and the corresponding times $\{t_1 \ldots t_N\}$ of the acquired samples $\{S_1 \ldots S_N\}$ is established. Typically, this mapping involves a linear function relating the amplitudes $\{A_1 \ldots A_N\}$ and times $\{t_1 \ldots t_N\}$, a polynomial relating the amplitudes $\{A_1 \ldots A_N\}$ and times $\{t_1 \ldots t_N\}$, or a look-up table relating the amplitudes $\{A_1 \ldots A_N\}$ and times $\{t_1 \ldots t_N\}$. However, any number of suitable techniques are alternatively used to establish this mapping between the amplitudes $\{A_1 \ldots A_N\}$ and times $\{t_1 \ldots t_N\}$ of the acquired samples $\{S_1 \ldots S_N\}$.

Figure 4C:
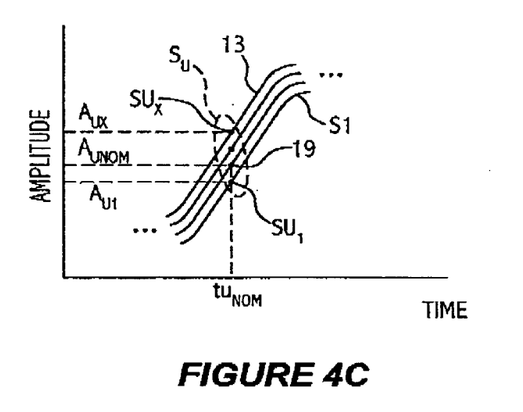
Figure 4D:
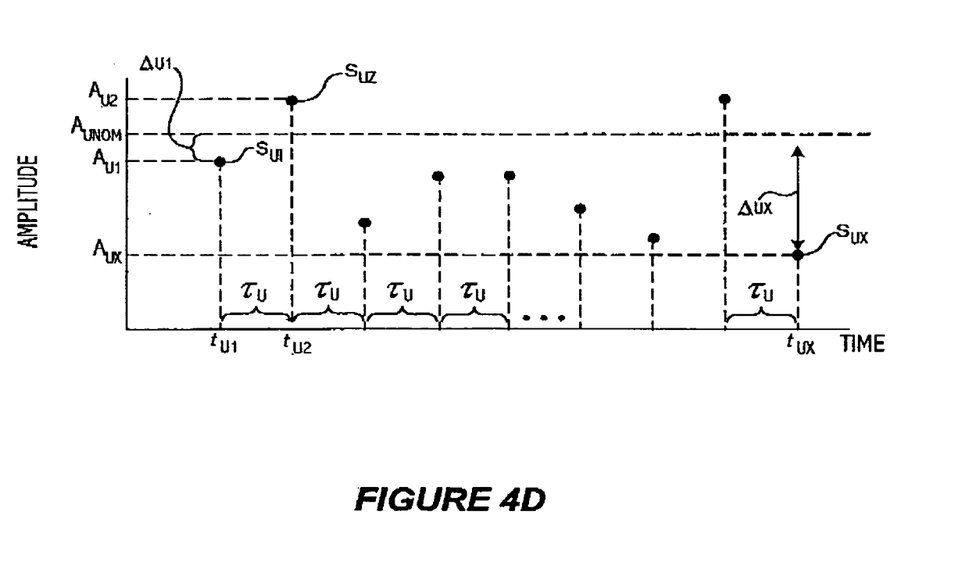

In step 22c, a set $S_U$ of samples $\{S_{U1} \ldots S_{UX}\}$ is acquired at a designated position 19 on the amplitude transition 13 characterized in step 22a. Consistent with the example above, the designated position 19 is the midpoint of the rising edge transition shown in FIG. 4B. The designated position 19 is at a nominal time position $tu_{NOM}$ that has a corresponding nominal amplitude $A_{UNOM}$. Timing instabilities of the repetitive signal S1, including periodic jitter, result in the amplitudes $\{A_{U1} \ldots A_{UX}\}$ of acquired samples $\{S_{U1} \ldots S_{UX}\}$ deviating from the nominal amplitude $A_{UNOM}$, as shown in FIGS. 4C–4D. FIG. 4C is an equivalent-time representation of the repetitive signal S1 showing repeating occurrences of the amplitude transition 13 on which the designated position 19 is located.

While the timing instabilities vary the timing of the repetitive signal S1, the highly stable time base of the sampler 14 within the sampling system 10 enables the acquired samples $\{S_{U1} \ldots S_{UX}\}$ within the set $S_U$ to be periodically acquired at times $\{tu_1 \ldots tu_X\}$ spaced by precisely defined, uniform time intervals $t_U$. The time intervals $t_U$ between the times $\{tu_1 \ldots tu_X\}$ are each equal to a fixed integer multiple M of the pattern length P1 associated with the repetitive signal S1. Thus, samples $\{S_{U1} \ldots S_{UX}\}$ within the set $S_U$ are acquired every Mth repetition of the pattern length P1 as shown in the representation of the acquired samples $\{S_{U1} \ldots S_{UX}\}$ of FIG. 4D.

In step 22d, a corresponding jitter value is assigned to each of the samples $\{S_{U1} \ldots S_{UX}\}$ in the set $S_U$ of periodically acquired samples in step 22c, resulting in a set $J_U$ of jitter values. This assignment includes determining for the samples $\{S_{U1} \ldots S_{UX}\}$ in the set $S_U$, the deviations $\{\Delta_{U1} \ldots \Delta_{UX}\}$ of the amplitudes $\{A_{U1} \ldots A_{UX}\}$ of each of the samples $\{S_{U1} \ldots S_{UX}\}$ from the nominal amplitude $A_{UNOM}$. The mapping of amplitudes $\{A_1 \ldots A_N\}$ and times $\{t_1 \ldots t_N\}$ established in step 22b is then used to convert the determined amplitude deviations $\{\Delta_{U1} \ldots \Delta_{UX}\}$ to corresponding timing deviations. The resulting timing deviations comprise the set $J_U$ of jitter values. When a linear mapping is established in step 22b, the set $J_U$ of jitter values is obtained by dividing the amplitude deviations $\{\Delta_{U1} \ldots \Delta_{UX}\}$ by the slope of the linear function relating amplitudes $\{A_1 \ldots A_N\}$ and times $\{t_1 \ldots t_N\}$. However, when a polynomial mapping is established in step 22b, the set $J_U$ of jitter values is obtained by evaluating the polynomial for each of the amplitude deviations $\{\Delta_{U1} \ldots \Delta_{UX}\}$ from the nominal amplitude $A_{UNOM}$. When the mapping in step 22b is a look-up table, the set $J_U$ of jitter values is assigned according to the look-up table, typically using interpolation to accommodate deviations from the nominal amplitude $A_{UNOM}$ that fall between values in the look-up table.

In step 22e, the set $J_U$ of jitter values resulting from step 22d is transformed to the corresponding spectrum SPER using a Discrete Fourier Transform or other suitable transform between the time domain and the frequency domain. An exemplary spectrum SPER based on the set $S_U$ of samples $\{S_{U1} \ldots S_{UX}\}$ is shown in FIG. 4A. From this spectrum SPER, the array F of frequencies f is established for the embodiment of the present invention in which the array F includes the frequency $f_{PEAK}$ of an identified signal peak $S_{PEAK}$ within the spectrum SPER and frequencies offset from the frequency $f_{PEAK}$ of the signal peak $S_{PEAK}$ by the integer multiples n of the sampling rate $R_S$ at which the samples $\{S_{U1} \ldots S_{UX}\}$ in step 22c are periodically acquired. While an array F is shown associated with one of the signal peaks $S_{PEAK}$ in the spectrum SPER, a separate array F can be established based on other signal peaks identified in the spectrum.

Figure 4E:
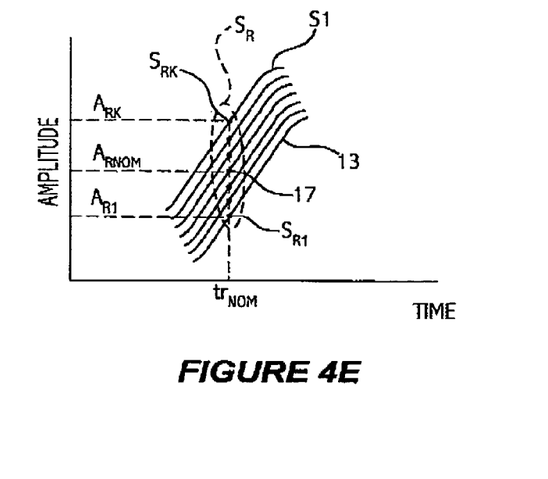

Once the array F is established in step 22 via steps 22a–22e or other means according to the above-recited embodiments of the present invention, the remaining steps 24–28 of the method 20 are executed. In step 24, the set $S_r$ of pseudo-randomly timed samples is acquired at the designated position 17 on a designated amplitude transition of the repetitive signal S1 as shown in FIG. 4E. In the example where the array F of frequencies f is established according to steps 22a–22e, the designated position 17 can be timed by the sampler 14 to lie on the amplitude transition 13 characterized in steps 22a–22b so that the relationship between amplitudes $\{A_1 \ldots A_N\}$ and times $\{t_1 \ldots t_N\}$ of the acquired samples $\{S_1 \ldots S_N\}$ established in steps 22a and 22b can be used in the assignment of jitter values in step 26. When the designated position 17 lies on this amplitude transition 13, periodic jitter associated with the repetitive signal S1 can also distinguished from data dependent jitter associated with the repetitive signal S1.

Figure 4F:
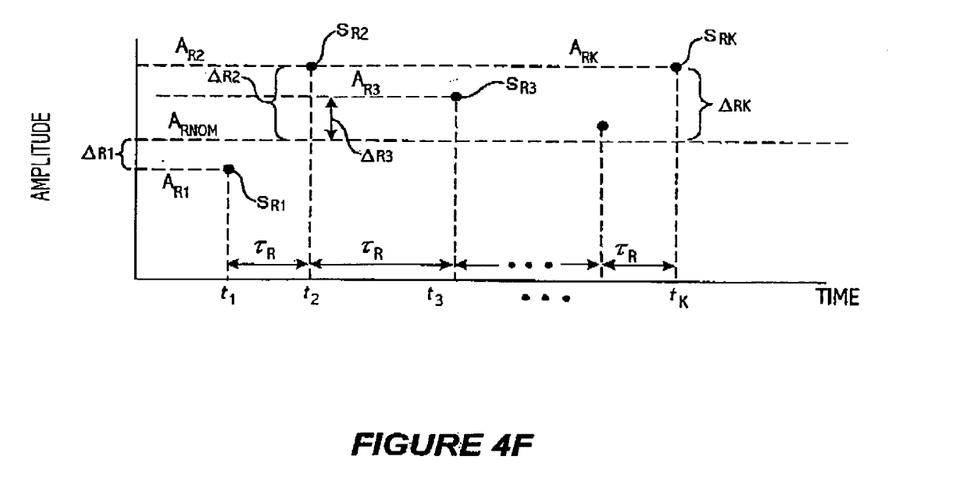

FIG. 4E is an equivalent-time representation of the repetitive signal S1 showing repeating occurrences of the amplitude transition on which the designated position 17 is located. In the exemplary waveform represented in FIG. 4E, the designated position 17 is shown on the midpoint of a rising edge transition. The designated position 17 is at a nominal time position $tr_{NOM}$ on this amplitude transition that has a corresponding nominal amplitude $A_{RNOM}$. However, timing instabilities of the repetitive signal S1, including periodic jitter, result in the amplitudes $\{A_{R1} \ldots A_{RK}\}$ of the acquired samples $\{S_{R1} \ldots S_{RK}\}$ within the set $S_r$ deviating from the nominal amplitude $A_{RNOM}$, as shown in FIGS. 4E–4F. While the timing instabilities vary the timing of the repetitive signal S1, the highly stable time base of the sampler 14 within the sampling system 10 enables the acquired samples $\{S_{R1} \ldots S_{RK}\}$ within the set $S_r$ to be acquired at precisely defined times $t_k$.

The samples $\{S_{R1} \ldots S_{RK}\}$ in the set $S_r$ are timed according to the relationship of equation 1, where $t_k$ represents the timing of the kth acquired sample, L is an integer, $r_k$ is a random integer associated with the kth acquired sample, and where P1 is the pattern length P1 associated with the repetitive signal S1 and R1 is the bit rate R1 associated with the repetitive signal S1, as previously designated.

$$t_{k+1} = t_k + \left(\frac{P1}{R1}\right)(L+r_k) \qquad (1)$$

Equation 1 shows that successive samples $t_k$, $t_{k+1}$ within the set $S_r$ are acquired at time intervals tr that are pseudo-random integer multiples $L+r_k$ of the ratio of the pattern length P1 to the bit rate R1.

In step 26 of the method 20, a jitter value Jitter(k) is assigned to each of the samples $\{S_{R1} \ldots S_{RK}\}$ in the set $S_r$, where k is an integer such that $0 \leq k \leq K$, to provide the corresponding set $J_r$ of jitter values. This assignment includes determining for the samples $\{S_{R1} \ldots S_{RK}\}$ in the set $S_r$, deviations $\{\Delta_{R1} \ldots \Delta_{RK}\}$ of the amplitudes $\{A_{R1} \ldots A_{RK}\}$ of the samples from the nominal amplitude $A_{RNOM}$ (shown in FIG. 4F) and includes converting the determined amplitude deviations $\{\Delta_{R1} \ldots \Delta_{RK}\}$ to corresponding timing deviations. The resulting timing deviations comprise the set $J_r$ of jitter values Jitter(k).

This assignment is based on the relationship between amplitude and time on the amplitude transition of the repetitive signal S1 upon which the designated position 17 is positioned, and is determined analogously to the assignment of jitter values in step 22d to the periodically timed samples acquired in step 22c, with the exception that here, the samples $\{S_{R1} \ldots S_{RK}\}$ are acquired at the non-uniform time intervals tr determined by equation 1. When the designated position 17 coincides with the amplitude transition 13 on which the mapping of amplitudes $\{A_1 \ldots A_N\}$ and times $\{t_1 \ldots t_N\}$ of step 22b is established, this mapping can be used in assigning the jitter values to the set $S_r$ of samples $\{S_{R1} \ldots S_{RK}\}$. For example, when a linear mapping is established in step 22b, the set $J_r$ of jitter values is obtained by dividing the amplitude deviations $\{\Delta_{R1} \ldots \Delta_{RK}\}$ by the slope of the linear function relating amplitudes $\{A_1 \ldots A_N\}$ and times $\{t_1 \ldots t_N\}$ on the characterized amplitude transition 13. When a polynomial mapping is established in step 22b, the set $J_r$ of jitter values is obtained by evaluating the polynomial for each of the deviations $\{\Delta_{R1} \ldots \Delta_{RK}\}$ of the amplitudes $\{_{R1} \ldots A_{RK}\}$ from the nominal amplitude $A_{RNOM}$. When the mapping in step 22b is a look-up table, the set $J_r$ of jitter values is assigned according to the look-up table, typically using interpolation to accommodate amplitude deviations $\{\Delta_{R1} \ldots \Delta_{RK}\}$ from the nominal amplitude $A_{RNOM}$ that fall between values in the look-up table as needed.

However, when the designated position 17 does not coincide with the amplitude transition 13 on which the mapping between amplitudes $\{A_1 \ldots A_N\}$ and times $\{t_1 \ldots t_N\}$ is established in steps 22a–22b, a separate mapping between amplitude and time can be developed for the amplitude transition that contains the designated position 17 in a manner However, when the designated position 17 does not coincide with the amplitude transition 13 on which the mapping between amplitudes $\{A_1 \ldots A_N\}$ and times $\{t_1 \ldots t_N\}$ is established in steps 22a–22b, a separate mapping between amplitude and time can be developed for the amplitude transition that contains the designated position 17 in a manner similar to steps 22a and 22b. This mapping can then be used to convert the amplitude deviations $\{\Delta_{R1} \ldots \Delta_{RK}\}$ to the timing deviations that comprise the set $J_r$ of jitter values.

In step 28 of the method 20, a frequency is selected from the array F of frequencies f based on a correlation of the assigned jitter values Jitter(k) in the set $J_r$ with frequencies f in the array F. An exemplary correlation is shown in equation 2, where K is the number of acquired samples $\{S_{R1} \ldots S_{RK}\}$ in the set $S_r$, and where f represents the frequencies in the array F. The periodic jitter associated with the repetitive signal S1 is designated to have the frequency $f_j$, which is the frequency within the array F of frequencies f that has the highest correlation R(f) to the assigned jitter values Jitter(k) in the set $J_r$.

$$R(f) = \left| \frac{1}{K} \sum_k \text{Jitter}(k) \cdot e^{-j2\pi \cdot t_k f} \right| \qquad (2)$$

When a linear function relates amplitudes and times on the amplitude transition that contains the designated position 17, the amplitudes $\{A_{R1} \ldots A_{RK}\}$ of the samples $\{S_{R1} \ldots S_{RK}\}$ and the jitter values Jitter(k) in the set $J_r$ of jitter values are related by a constant. Based on this relationship, in one embodiment of the present invention, the assignment of jitter values to the samples $\{S_{R1} \ldots S_{RK}\}$ in step 26 comprises determining the amplitudes $\{A_{R1} \ldots A_{RK}\}$ of the acquired samples $\{S_{R1} \ldots S_{RK}\}$, and the selection of the frequency $f_j$ from the array F of frequencies f based on a correlation of the assigned jitter frequencies f that has the highest correlation to the amplitudes of the acquired samples $\{S_{R1} \ldots S_{RK}\}$.

While the embodiments of the present invention have been illustrated in detail, it should be apparent that modifications and adaptations to these embodiments may occur to one skilled in the art without departing from the scope of the present invention as set forth in the following claims.

The invention claimed is:

1. A method for characterizing jitter of a repetitive signal, comprising:
   establishing an array of frequencies;
   acquiring a set of pseudo-randomly timed samples at a first designated position on the repetitive signal;
   assigning a first set of jitter values to the set of pseudo-randomly timed samples;
   selecting a frequency from the array based on a correlation of the assigned jitter values in the first set with the frequencies in the array, wherein the selected frequency has the highest correlation.

2. The method of claim 1 wherein establishing the array of frequencies includes acquiring periodically timed samples at a second designated position, assigning a second set of jitter values to the periodically timed samples, and transforming the second set of jitter values to a corresponding spectrum, wherein the array of frequencies includes the frequency of an identified signal peak in the spectrum and frequencies at integer multiples of the rate at which the periodically timed samples are acquired.

3. The method of claim 2 wherein assigning the second set of jitter values to the periodically timed samples includes establishing a mapping between amplitude and time on an amplitude transition that includes the second designated position.

4. The method of claim 3 wherein the mapping includes one of a linear function relating amplitude and time, a polynomial relating amplitude and time, and a look-up table relating amplitude and time.

5. The method of claim 1 wherein assigning the first set of jitter values to the set of pseudo-randomly timed samples comprises determining the amplitudes of the pseudo-randomly timed samples in the set, and wherein selecting a frequency from the array based on a correlation of the assigned jitter values in the first set with the frequencies in the array comprises selecting a frequency from the array based on a correlation of the determined amplitudes with the frequencies in the array.

6. The method of claim 1 wherein the set of pseudo-randomly timed samples is acquired at pseudo-random integer multiples of a ratio of a pattern length of the repetitive signal to a bit rate of the repetitive signal.

7. The method of claim 2 wherein the set of pseudo-randomly timed samples is acquired at pseudo-random integer multiples of a ratio of a pattern length of the repetitive signal to a bit rate of the repetitive signal.

8. The method of claim 4 wherein the set of pseudo-randomly timed samples is acquired at pseudo-random integer multiples of a ratio of a pattern length of the repetitive signal to a bit rate of the repetitive signal.

9. A method for characterizing jitter of a repetitive waveform, comprising:
    identifying a frequency of a signal peak in a spectrum of the repetitive signal resulting from periodic sampling of the repetitive signal;
    establishing an array of frequencies based on the signal peak;
    acquiring a set of pseudo-randomly timed samples at a first position on an amplitude transition of the repetitive signal;
    assigning a first set of jitter values to each of the pseudo-randomly timed samples in the acquired set;
    selecting a frequency from the array of frequencies based on a correlation of the assigned jitter values in the first set with the frequencies in the array.

10. The method of claim 9 wherein the array of frequencies includes the identified frequency of the signal peak and integer multiples of the rate of the periodic sampling of the repetitive signal.

11. The method of claim 9 wherein identifying a frequency of the signal peak in a spectrum of the repetitive signal resulting from periodic sampling of the repetitive signal includes acquiring periodically timed samples at a second position, assigning a second set of jitter values corresponding to the periodically timed samples, and transforming the jitter values in the second set to a corresponding spectrum.

12. The method of claim 10 wherein identifying a frequency of the signal peak in a spectrum of the repetitive signal resulting from periodic sampling of the repetitive signal includes acquiring periodically timed samples at the second position, assigning a second set of jitter values corresponding to the periodically timed samples, and transforming the jitter values in the second set to a corresponding spectrum.

13. The method of claim 9 wherein assigning the second set of jitter values to the pseudo-randomly timed samples in the acquired set comprises determining the amplitudes of the pseudo-randomly timed samples in the acquired set, and wherein selecting a frequency from the array based on the correlation of the assigned jitter values in the first set with the frequencies in the array comprises selecting a frequency from the array based on a correlation of the determined amplitudes with the frequencies in the array.

14. The method of claim 9 wherein the set of pseudo-randomly timed samples is acquired at pseudo-random integer multiples of a ratio of a pattern length of the repetitive signal to a bit rate of the repetitive signal.

15. The method of claim 10 wherein the set of pseudo-randomly timed samples is acquired at pseudo-random integer multiples of a ratio of a pattern length of the repetitive signal to a bit rate of the repetitive signal.

16. The method of claim 11 wherein the set of pseudo-randomly timed samples is acquired at pseudo-random integer multiples of a ratio of a pattern length of the repetitive signal to a bit rate of the repetitive signal.

17. A system for characterizing jitter of a repetitive waveform, comprising:
    a sampler acquiring a set of pseudo-randomly timed samples at a designated position on a designated amplitude transition of the repetitive signal;
    a processor coupled to the sampler, assigning a jitter value to each of the samples in the acquired set and selecting a frequency from an array of frequencies based on a correlation of the assigned jitter values with the frequencies in the array.

18. The system of claim 17 wherein the array of frequencies is established by acquiring periodically timed samples at the designated position, assigning corresponding jitter values to the periodically timed samples, and transforming the jitter values assigned from the periodically timed samples to a corresponding spectrum, wherein the array of frequencies includes the frequency of an identified signal peak in the spectrum and frequencies at integer multiples of the rate at which the periodically timed samples are acquired.

19. The system of claim 17 wherein assigning a jitter value to each of the pseudo-randomly timed samples in the acquired set comprises determining the amplitudes of each of the pseudo-randomly timed samples in the acquired set, and wherein selecting a frequency from the array based on the correlation of the assigned jitter values from the pseudo-randomly timed samples with the frequencies in the array comprises selecting a frequency from the array based on a correlation of the determined amplitudes with the frequencies in the array.

20. The system of claim 17 wherein the set of pseudo-randomly timed samples is acquired at pseudo-random integer multiples of a ratio of a pattern length of the repetitive signal to a bit rate of the repetitive signal.

* * * * *

UNITED STATES PATENT AND TRADEMARK OFFICE
CERTIFICATE OF CORRECTION

PATENT NO. : 7,050,915 B2  Page 1 of 1
APPLICATION NO. : 10/687031
DATED : May 23, 2006
INVENTOR(S) : Viss It is certified that error appears in the above-identified patent and that said Letters Patent is hereby corrected as shown below:

On the Title page, in item (74), in "Attorney, Agent, or Firm", in column 2, line 1, delete "Iwperato" and insert -- Imperato --, therefor.

Signed and Sealed this

Nineteenth Day of September, 2006

JON W. DUDAS
*Director of the United States Patent and Trademark Office*